United States Patent
Park et al.

(10) Patent No.: US 10,067,623 B2
(45) Date of Patent: Sep. 4, 2018

(54) FLEXIBLE TOUCH SCREEN PANEL AND FLEXIBLE DISPLAY DEVICE WITH THE SAME

(71) Applicant: Samsung Display Co., Ltd., Yongin-si, Gyeonggi-do (KR)

(72) Inventors: Jung-Mok Park, Yongin-si (KR); Kwan-Young Han, Yongin-si (KR); Chang-Bum Kim, Yongin-si (KR); Jae-Hyung Jo, Yongin-si (KR); Hyung-Chul Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/245,785

(22) Filed: Aug. 24, 2016

(65) Prior Publication Data

US 2016/0364048 A1    Dec. 15, 2016

Related U.S. Application Data

(62) Division of application No. 13/776,932, filed on Feb. 26, 2013, now abandoned.

(30) Foreign Application Priority Data

Nov. 14, 2012    (KR) .................. 10-2012-0128722

(51) Int. Cl.
   *G06F 3/041*       (2006.01)
   *G06F 3/044*       (2006.01)
   (Continued)

(52) U.S. Cl.
   CPC .............. *G06F 3/044* (2013.01); *G06F 3/047* (2013.01); *G06F 3/0412* (2013.01);
   (Continued)

(58) Field of Classification Search
   CPC ........ G06F 3/044; G06F 3/0412; G06F 3/041; G06F 2203/04102; G06F 2203/04103;
   (Continued)

(56) References Cited

U.S. PATENT DOCUMENTS

| 6,680,731 B2 | 1/2004 | Gerpheide et al. |
| 2007/0229470 A1 | 10/2007 | Snyder et al. |

(Continued)

FOREIGN PATENT DOCUMENTS

| KR | 10-2009-0126099 | 12/2009 |
| KR | 10-2011-0123987 | 11/2011 |

(Continued)

*Primary Examiner* — Roberto Flores
(74) *Attorney, Agent, or Firm* — H.C. Park & Associates, PLC

(57) ABSTRACT

A flexible touch screen panel includes a thin film substrate divided into an active area and a non active area positioned at the outside of the active area; sensing patterns formed on the active area of a first surface of the thin film substrate, including first sensing cells formed to be connected along a first direction and second sensing cells formed to be connected along a second direction; and sensing lines formed on the non active area of the first surface of the thin film substrate. The sensing lines are connected to the sensing patterns. In the touch screen panel, the area and/or interval of the sensing cells formed on a first region, which is capable of being bent by predetermined curvature about a folding axis is different from the area and/or interval of the sensing cells formed on a second region as a flat region except the first region.

7 Claims, 5 Drawing Sheets

(51) Int. Cl.
*G06F 3/047* (2006.01)
*H01L 27/32* (2006.01)

(52) U.S. Cl.
CPC .. *H01L 27/323* (2013.01); *G06F 2203/04102* (2013.01); *G06F 2203/04103* (2013.01)

(58) Field of Classification Search
CPC ........ G06F 2203/04105; G06F 1/1652; G09G 2380/02; G02F 1/133305; H01M 1/0288
USPC .......... 345/173–184; 174/250; 324/600–690, 324/519; 178/18.01–20.04
See application file for complete search history.

(56) References Cited

U.S. PATENT DOCUMENTS

| | | |
|---|---|---|
| 2009/0174832 A1 | 7/2009 | Lee |
| 2009/0295332 A1 | 12/2009 | Yang et al. |
| 2010/0245246 A1 | 9/2010 | Rosenfeld et al. |
| 2010/0265212 A1 | 10/2010 | Sekiguchi et al. |
| 2010/0295814 A1 | 11/2010 | Kent et al. |
| 2011/0012845 A1 | 1/2011 | Rothkopf et al. |
| 2011/0048813 A1 | 3/2011 | Yilmaz |
| 2011/0096025 A1 | 4/2011 | Slobodin et al. |
| 2011/0210937 A1 | 9/2011 | Kee et al. |
| 2011/0273383 A1 | 11/2011 | Jeon et al. |
| 2012/0025851 A1* | 2/2012 | Homeijer ............ G01D 5/2412 324/686 |
| 2012/0032916 A1 | 2/2012 | Enoki |
| 2012/0081329 A1* | 4/2012 | Kim ....................... G06F 3/045 345/174 |
| 2012/0086666 A1 | 4/2012 | Badaye et al. |
| 2012/0092324 A1 | 4/2012 | Buchan et al. |
| 2012/0098783 A1 | 4/2012 | Badaye et al. |
| 2012/0162099 A1 | 6/2012 | Yoo et al. |
| 2012/0212433 A1 | 8/2012 | Lee et al. |
| 2013/0049771 A1 | 2/2013 | Peng et al. |
| 2013/0106441 A1 | 5/2013 | Yilmaz et al. |
| 2013/0193988 A1 | 8/2013 | Benkley, III |
| 2013/0215035 A1 | 8/2013 | Guard |
| 2013/0234974 A1 | 9/2013 | Guard |

FOREIGN PATENT DOCUMENTS

| | | |
|---|---|---|
| KR | 10-2011-0124995 | 11/2011 |
| KR | 10-2012-0004978 | 1/2012 |
| KR | 10-2012-0022733 | 3/2012 |
| KR | 10-2013-0126007 | 11/2013 |

* cited by examiner

FLEXIBLE TOUCH SCREEN PANEL AND FLEXIBLE DISPLAY DEVICE WITH THE SAME

CROSS-REFERENCE TO RELATED APPLICATIONS AND CLAIM OF PRIORITY

This application is a divisional application of the prior application Ser. No. 13/776,932 filed in the U.S. Patent & Trademark Office on Feb. 26, 2013 and assigned to the assignee of the present invention. Furthermore, this application claims priority to and the benefit of Korean Patent Application No. 10-2012-0128722, filed on Nov. 14, 2012, in the Korean Intellectual Property Office, the entire content of which is incorporated herein by reference.

BACKGROUND

Field

An aspect of the present invention relates to a touch screen panel, and more particularly, to a flexible touch screen panel and a flexible display device with the same.

Description of the Related Art

A touch screen panel is an input device that allows a user's instruction to be inputted by selecting an instruction content displayed on a screen of an image display device or the like with a user's hand or object.

To this end, the touch screen panel is formed on a front face of the image display device to convert a contact position into an electrical signal. Here, the user's hand or object is directly in contact with the touch screen panel at the contact position. Accordingly, the instruction content selected at the contact position is inputted as an input signal to the image display device.

Since such a touch screen panel can be substituted for a separate input device connected to an image display device, such as a keyboard or mouse, its application fields have been gradually extended.

Touch screen panels are divided into a resistive overlay touch screen panel, a photosensitive touch screen panel, a capacitive touch screen panel, and the like. Among these touch screen panels, the capacitive touch screen panel converts a contact position into an electrical signal by sensing a change in capacitance formed between a conductive sensing pattern and an adjacent sensing pattern, ground electrode or the like when a user's hand or object is in contact with the touch screen panel.

Generally, such a touch screen panel is frequently commercialized by being attached to an outer face of a flat panel display device such as a liquid crystal display device or organic light emitting display device. Therefore, the touch screen panel requires characteristics of high transparency and thin thickness.

A flexible image display device has recently been developed, and in this case, a touch screen panel attached on the flexible image display device also requires flexibility.

However, in the related art capacitive touch screen panel, sensing patterns, etc. are generally formed on a glass substrate, and the glass substrate should have no less than a predetermined thickness to be conveyed in processes. Therefore, the glass substrate does not satisfy the thin characteristic required in the touch screen panel, and cannot implement the flexibility.

SUMMARY

Embodiments provide a flexible touch screen panel having sensing patterns as touch sensors formed on a thin film substrate having flexibility, in which the area and/or interval of the sensing cells formed on a first region having a predetermined curvature based on a folding axis about which the touch screen panel is bent and the sensing cells formed on a second region as a flat region except the first region are controlled, so that it is possible to minimize the difference in touch sensitivity between the first and second regions, thereby improving the accuracy and precision of touch recognition.

Embodiments also provide a flexible display device having the flexible touch screen panel described above.

According to an aspect of the present invention, there is provided a flexible touch screen panel, including: a thin film substrate including an active area and a non active area positioned at the outside of the active area; sensing patterns formed on the active area of a first surface of the thin film substrate, and including first sensing cells formed to be connected along a first direction and second sensing cells formed to be connected along a second direction; and sensing lines formed on the non active area of the first surface of the thin film substrate, and connected to the sensing patterns. The flexible touch screen panel has a first region, which is capable of being bent by a predetermined curvature about a folding axis, and a second region as a flat region, areas of the sensing cells formed on the first region being different from areas of the sensing cells formed on the second region, or an interval between two of the sensing cells formed on the first region being different from an interval between two of the sensing cells formed on the second region.

When the thin film substrate having the sensing cells formed thereon is bent in the opposite direction to the first surface thereof, the interval between the first and second sensing cells formed on the first region may be smaller than that between the first and second sensing cells formed on the second region, or the area of the first and second sensing cells formed on the first region may be larger than that of the first and second sensing cells formed on the second region.

When the thin film substrate having the sensing cells formed thereon is bent in the direction of the first surface thereof, the interval between the first and second sensing cells formed on the first region may be larger than that between the first and second sensing cells formed on the second region, or the area of the first and second sensing cells formed on the first region may be smaller than that of the first and second sensing cells formed on the second region.

The sensing patterns may further include first connecting lines connecting adjacent first sensing cells, and second connecting lines connecting adjacent second sensing cells. An insulation layer may be interposed between the first connecting lines and the second connecting lines.

The first and second sensing patterns may be formed in different layers. The first sensing cells may be formed on the first surface of the thin film substrate, and the second sensing cells may be formed in the direction intersecting the first sensing cells on the insulation layer formed on the first surface of the thin film substrate having the first sensing cells.

The first sensing cells may be arranged in the direction parallel with the folding axis, and the area and interval of the first sensing cells formed on the first region may be different from those of the first sensing cells formed on the second region.

Each of the first sensing cells formed on the first region may be divided into a plurality of divided sensing cells, and the area and interval of the divided sensing cells may be formed smaller than those of the first sensing cells formed on the second region.

The first sensing cells arranged in the first direction may be made of indium tin oxide (ITO), and the second sensing cells arranged in the second direction may be made of silver nano-wires.

The thin film substrate may be made of a polyimide material. The thickness of the thin film substrate may be about 0.005 mm to 0.05 mm.

According to an aspect of the present invention, there is provided a flexible display device including: a thin film substrate divided into an active area and a non active area positioned at the outside of the active area; sensing patterns formed on the active area of a first surface of the thin film substrate, and including first sensing cells formed to be connected along a first direction and second sensing cells formed to be connected along a second direction; sensing lines formed on the non active area of the first surface of the thin film substrate, and connected to the sensing patterns; and a display device is attached to the thin film substrate so as to face the sensing patterns and the sensing lines formed on the first surface of the thin film substrate. The flexible display device has a first region, which is capable of being bent by a predetermined curvature about a folding axis, and a second region as a flat region, areas of the sensing cells formed on the first region being different from areas of the sensing cells formed on the second region, or an interval between two of the sensing cells formed on the first region being different from an interval between two of the sensing cells formed on the second region.

The display device may include an organic light emitting display device.

A polarizing film and a window substrate may be sequentially attached to a second surface of the thin film substrate through a transparent adhesive. The window substrate may be formed of at least one of polymethyl methacrylate (PMMA), acryl and polyester (PET).

As described above, according to the present invention, the area and/or interval of the sensing cells formed on a first region having a predetermined curvature based on a folding axis about which the touch screen panel is bent and the sensing cells formed on a second region as a flat region except the first region are controlled, so that it is possible to minimize the difference in touch sensitivity between the first and second regions, thereby improving the accuracy and precision of touch recognition.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
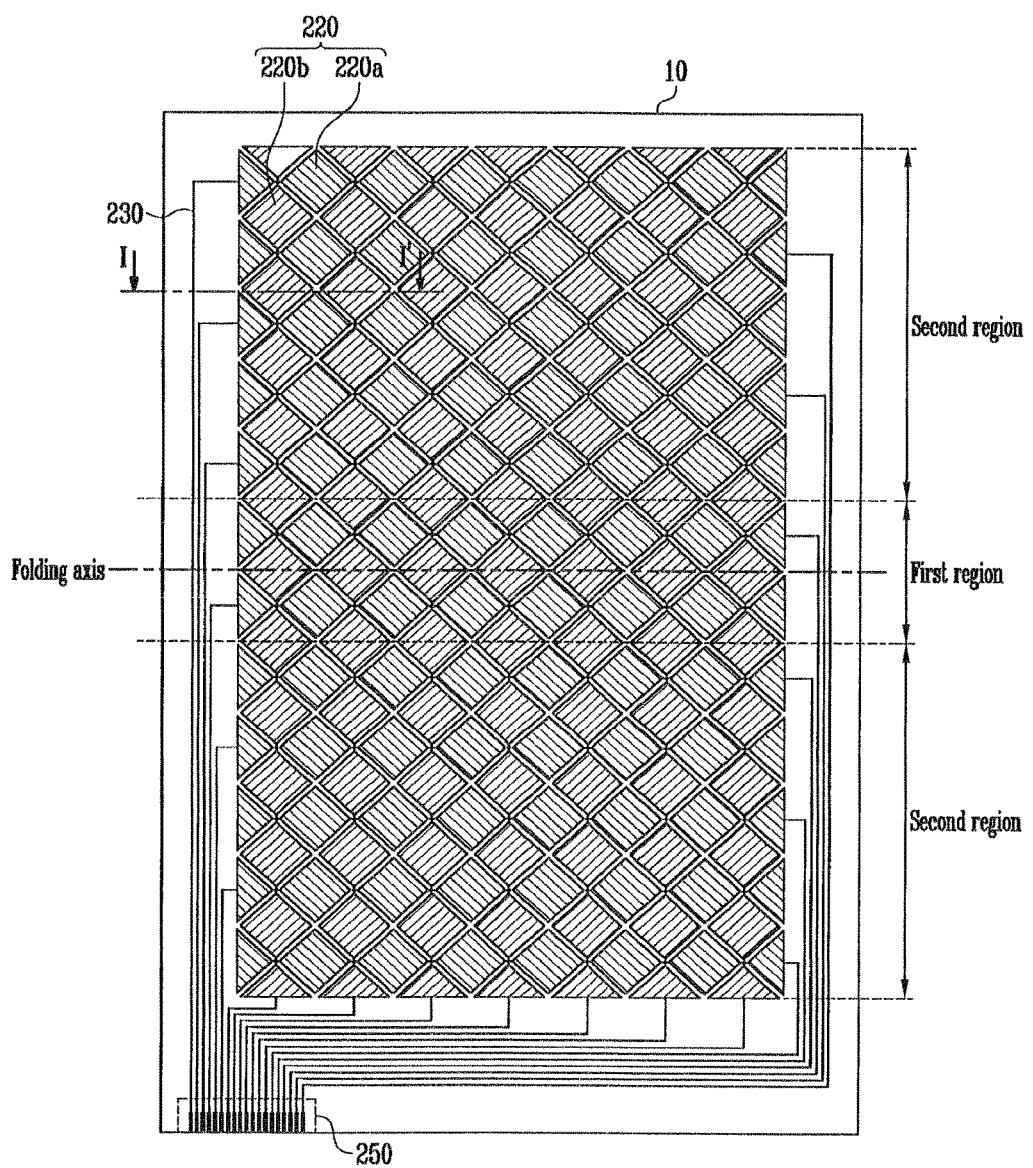
FIG. 1 is a plan view schematically showing a flexible touch screen panel according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, exemplary embodiments of the present invention will be described in detail with reference to the accompanying drawings.

Figure 2:
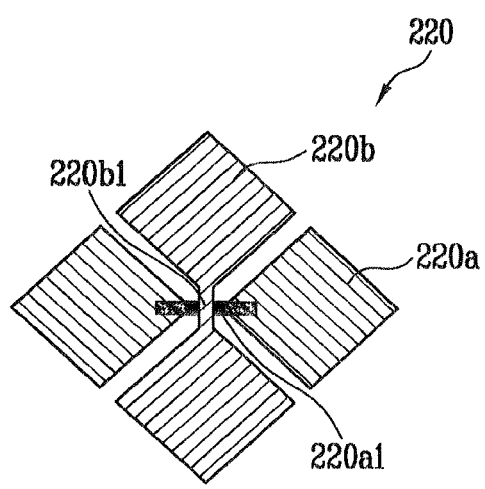
FIG. 2 is a main part enlarged view showing an example of a sensing pattern shown in FIG. 1.

FIG. 1 is a plan view schematically showing a flexible touch screen panel according to an embodiment of the present invention. FIG. 2 is a main part enlarged view showing an example of a sensing pattern shown in FIG. 1.

Referring to FIGS. 1 and 2, the touch screen panel according to this embodiment includes a thin film substrate 10 divided into an active area and a non active area positioned at the outside of the active area, and having flexibility; sensing patterns 220 formed on the active area of a first surface of the thin film substrate 10; and sensing lines 230 formed on the non active area of the first surface of the thin film substrate 10, and connecting the sensing patterns 220 to an external driving circuit (not shown) through a pad portion 250.

The thin film substrate 10 having the flexibility is implemented using a material having high thermal resistance and chemical resistance. In this embodiment, a case where polyimide (PI) is used as the material of the thin film substrate 10 will be described as an example.

That is, the touch screen panel according to this embodiment does not use an existing rigid material (e.g., glass, polyethylene terephthalate (PET), polycarbonate (PC), etc.) but uses the PI having the most excellent thermal resistance as material of the thin film substrate 10.

In this case, the thickness of the thin film substrate 10 may be about 0.005 mm to 0.05 mm, preferably about 0.01 mm (10 ftm), thereby securing flexibility. That is, the thin film substrate 10 having the flexibility can be bent, unlike the existing glass substrate.

As shown in FIG. 2, the sensing patterns 220 formed on the active area include a plurality of first sensing cells 220a formed to be connected for each row line along a row direction (first direction), a plurality of first connecting lines 220a1 connecting the first sensing cells 220a along the row direction, a plurality of second sensing cells 220b formed to be connected for each column line along a column direction (second direction), and a plurality of second connecting lines 220b1 connecting the second sensing cells 220b along the column direction.

The first sensing cells 220a and the second sensing cells 220b are alternately arranged so as not to overlap with each other, and the first connecting lines 220a1 and the second connecting lines 220b1 intersect each other. In this case, an insulation layer (element 270 shown in FIG. 5) for securing insulation is interposed between the first connecting lines 220a1 and the second connecting lines 220b1.

Meanwhile, the first sensing cells 220a may be integrally formed with the first connecting lines 220a1 using a transparent conductive material such as indium tin oxide (hereinafter, referred to as ITO) or may be formed separately from the first connecting lines 220a1 so that the first sensing cells 220a and the first connecting lines 220a1 are electrically connected to each other. The second sensing cells 220b may be integrally formed with the second connecting lines 220b1 using a transparent conductive material such as ITO or may be formed separately from the second connecting lines 220b1 so that the second sensing cells 220b and the second connecting lines 220b1 are electrically connected to each other.

For example, the second sensing cells 220b are integrally formed with the second connecting lines 220b1 by being patterned in the column direction. The first sensing cells 220a are patterned to respectively independent patterns between the second sensing cells 220b, and may be connected along the row direction by the first connecting lines 220a1 positioned above or below the first sensing patterns 220a.

In this case, the first connecting lines 220a1 may be electrically connected to the first sensing cells 220a by being directly contacted with the first sensing cells 220a above or below the first sensing cells 220a. Alternatively, the first connecting lines 220a1 may be electrically connected to the first sensing cells 220a through contact holes, etc.

The first connecting lines 220a1 may be formed using a transparent conductive material such as ITO or using an opaque low-resistance metal material. The first connecting lines 220a1 may be formed by adjusting their width, etc. so that the visibility of the patterns is prevented.

The sensing lines 230 shown in FIG. 1 are electrically connected to row lines of the first sensing cells 220a and column lines of the second sensing cells 220b, respectively, so as to connect the row and column lines to the external driving circuit (not shown) such as a position detecting circuit through the pad portion 250.

The sensing lines 230 are arranged on the non active area formed at the outside of the active area in which an image is displayed. Since the material of the sensing lines 230 is selected in a wide range, the sensing lines 230 may be formed of not only a transparent electrode material used to form the sensing patterns 220 but also a low-resistance metallic material such as molybdenum (Mo), silver (Ag), titanium (Ti), copper (Cu), aluminum (Al) or Mo/Al/Mo.

The touch screen panel according to this embodiment described above is a capacitive touch screen panel. If a contact object such as a user's finger or stylus pen comes in contact with the touch screen panel, a change in capacitance caused by a contact position is transferred from the sensing patterns 220 to the driving circuit (not shown) via the sensing lines 230 and the pad portion 250. Then, the change in capacitance is converted into an electrical signal by X and Y input processing circuits (not shown), thereby detecting the contact position.

The related art touch screen panels is implemented into a structure in which the sensing patterns shown in FIG. 2 are repetitively arranged with the same area at the same interval on the active area.

However, in the touch screen panel according to this embodiment, the thin film substrate 10 has the flexibility, and accordingly, the touch screen panel can be divided into a first region having a predetermined curvature based on a folding axis shown in FIG. 1, and a second region as a flat region except the first region. In other words, the first region is capable of being bent or folded about the folding axis.

In a case where the sensing patterns are repetitively arranged with the same area at the same interval on the active area, like those in the related art touch screen panel, regardless of the first and second regions, the area of sensing cells and the interval between the sensing cells formed on the first region having the predetermined curvature are different from the area of sensing cells and the interval between the sensing cells formed on the second flat region. As a result, the capacitance sensed in the sensing patterns formed on the first region is different from that sensed in the sensing patterns formed on the second region.

That is, in a case where the sensing patterns having the same structure as those in the related art touch screen panel are arranged on the thin film substrate 10, the touch sensitivity in the first region as the curved region is different from that in the second region as the flat region, and therefore, driving performance such as accuracy and precision of touch recognition may be degraded.

In order to solve such a problem, in this embodiment, the areas and/or intervals of the sensing cells formed on the first region having the predetermined curvature based on the folding axis about which the flexible touch screen panel is bent and the sensing cells formed on the second region as the flat region except the first region are adjusted, so that it is possible to minimize the difference in touch sensitivity between the first and second regions, thereby improving the accuracy and precision of touch recognition.

Hereinafter, the structures and arrangements of the sensing cells according to this embodiment will be described in detail with reference to FIGS. 3 and 4.

Here, the touch screen panel may be bent in the direction where a curved surface is formed toward the outside of the thin film substrate 10 having the sensing cells formed thereon, or may be bent in the opposite direction, i.e., the direction where a curved surface is formed toward the inside of the thin film substrate 10 having the sensing cells formed thereon.

In other words, the touch screen panel may be bent in the opposite direction to the first surface of the thin film substrate having the sensing cells formed thereon, or may be bent in the direction of the first surface of the thin film substrate having the sensing cells formed thereon. Hereinafter, the structures and arrangements of the sensing cells when the touch screen panel is bent in different directions will be described in detail.

Figure 3A:
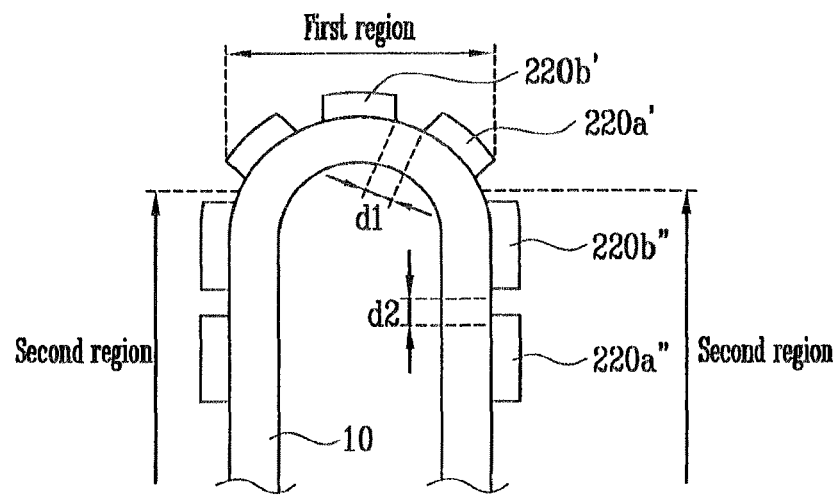
FIGS. 3A and 3B are views showing structures of sensing cells shown in FIG. 1 when a curved surface is formed toward the outside of the sensing cells.
Figure 3B:
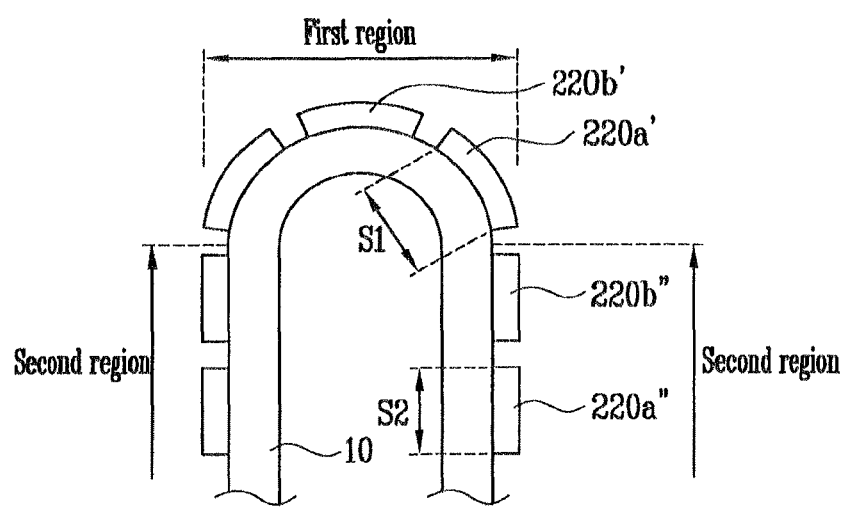

FIGS. 3A and 3B are views showing structures of sensing cells shown in FIG. 1 when a curved surface is formed toward the outside of the sensing cells (in the opposite direction to the first surface of the thin film substrate).

That is, in the embodiment shown in FIG. 3, the touch screen panel is bent in the direction where a curved surface is formed toward the outside of the thin film substrate 10 having the sensing cells formed thereon.

First, referring to FIG. 3A, there are shown first sensing cells 220a' and second sensing cells 220b' adjacent to the first sensing cells 220a', which are formed on a first region having a predetermined curvature by bending the thin film substrate 10, and first sensing cells 220a" and second sensing cells 220b" adjacent to the first sensing cells 220a", which are formed on a second region as a flat region.

If the thin film substrate 10 is bent as described above, the surface of the thin film substrate 10, corresponding to the first region as the curved region, becomes wider than the rest of the thin film substrate 10, corresponding to the second region as the flat region, according to the flexibility of the thin film substrate 10.

That is, if the sensing cells are repetitively arranged with the same area at the same interval, regardless of the first and second regions, the interval between the first and second sensing cells 220a' and 220b' formed on the first region becomes wider than that between the first and second sensing cells 220a" and 220b" formed on the second region when the thin film substrate 10 is bent as shown in FIG. 3A, which results in the occurrence of a difference between capacitances respectively sensed in the sensing patterns on the first and second regions.

In order to solve such a problem, in the embodiment shown in FIG. 3A, the interval (first interval) d1 between the first and second sensing cells 220a' and 220b' formed on the first region is formed narrower than that (second interval) d2 between the first and second sensing cells 220a" and 220b" formed on the second region. According to the structure described above, it is possible to minimize the difference between the capacitances respectively sensed in the sensing cells formed on the first and second regions.

In this case, the difference between the first and second intervals (d2−d1) corresponds to the degree at which the outer surface of the thin film substrate is enlarged by the bending of the thin film substrate, which can be optimized through several experiments.

Next, referring to FIG. 3B, there are shown first sensing cells 220a' and second sensing cells 220b' adjacent to the first sensing cells 220a', which are formed on a first region having a predetermined curvature by bending the thin film substrate 10, and first sensing cells 220a" and second sensing cells 220b" adjacent to the first sensing cells 220a", which are formed on a second region as a flat region.

If the thin film substrate 10 is bent in the direction where a curved surface is formed toward the outside of the thin film substrate 10 having the sensing cells formed thereon as described above, the area where the sensing cell 220a' or 220b' positioned on the first region as the curved region is touched to the first region by the radius of the curved surface, i.e., the curvature becomes narrower than that where the sensing cell 220a" or 220b" positioned on the second region as the flat region is touched to the second region.

That is, if the sensing cells are repetitively arranged with the same area at the same interval, regardless of the first and second regions, the contact area of the first or second sensing cell 220a' or 220b' positioned on the first region becomes narrower that of the first or second sensing cell 220a" or 220b" when the thin film substrate 10 is bent as shown in FIG. 3B, which results in the occurrence of a difference between capacitances respectively sensed in the sensing patterns on the first and second regions.

In order to solve such a problem, in the embodiment shown in FIG. 3B, the area (first area) S1 of the first or second sensing cell 220a' or 220b' formed on the first region is formed larger than that (second area) S2 of the first or second sensing cell 220a" or 220b" formed on the second region. According to the structure described above, it is possible to minimize the difference between the capacitances respectively sensed in the sensing cells formed on the first and second regions. In this case, the difference between the first and second areas (S1−S2) can be optimized through several experiments.

Figure 4A:
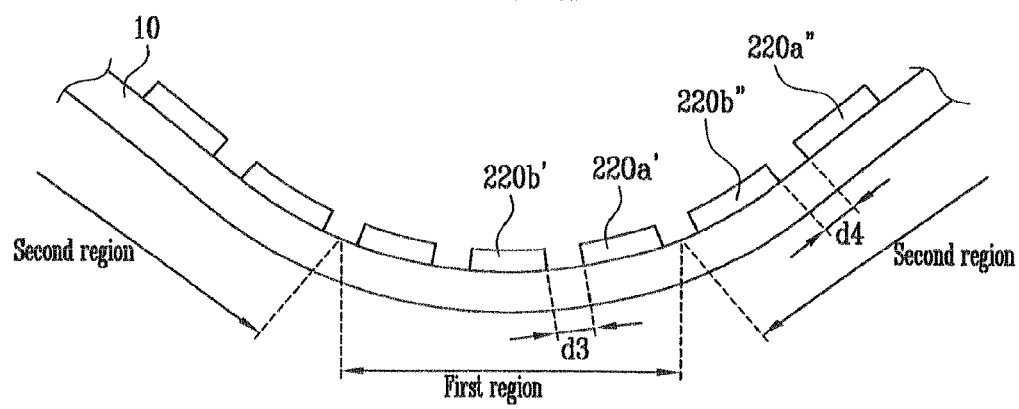
FIGS. 4A and 4B are views showing structures of the sensing cells shown in FIG. 1 when a curved surface is formed toward the inside of the sensing cells.
Figure 4B:
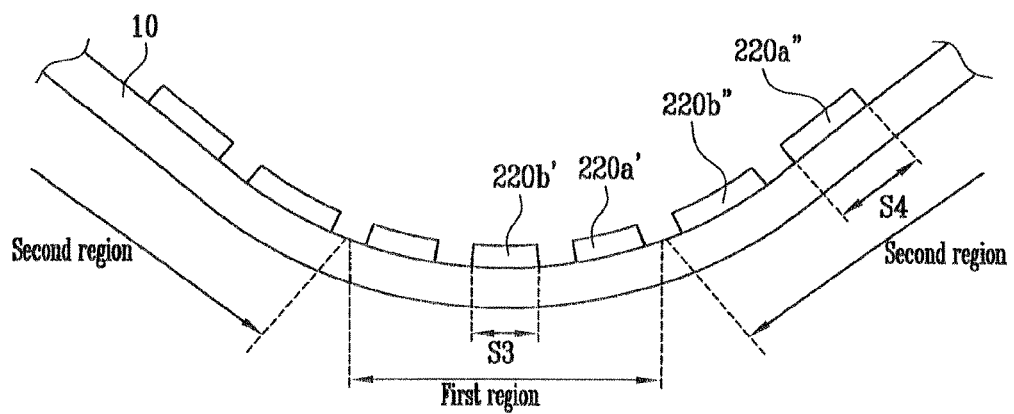

FIGS. 4A and 4B are views showing structures of the sensing cells shown in FIG. 1 when a curved surface is formed toward the inside of the sensing cells.

That is, in the embodiment shown in FIGS. 4A and 4B, the touch screen panel is bent in the direction where a curved surface is formed toward the inside of the thin film substrate 10 having the sensing cells formed thereon (in the direction to the first surface of the thin film substrate).

First, referring to FIG. 4A, there are shown first sensing cells 220a' and second sensing cells 220b' adjacent to the first sensing cells 220a', which are formed on a first region having a predetermined curvature by bending the thin film substrate 10, and first sensing cells 220a" and second sensing cells 220b" adjacent to the first sensing cells 220a", which are formed on a second region as a flat region.

If the thin film substrate 10 is bent as described above, the interval between the first and second sensing cells 220a' and 220b' formed on the first region becomes narrower than that between the first and second sensing cells 220a" and 220b" formed on the second region according to the flexibility of the thin film substrate 10, which results in the occurrence of a difference between capacitances respectively sensed in the sensing patterns on the first and second regions.

In order to solve such a problem, in the embodiment shown in FIG. 4A, the interval (third interval) d3 between the first and second sensing cells 220a' and 220b' formed on the first region is formed larger than that (fourth interval) d4 between the first and second sensing cells 220a" and 220b" formed on the second region. According to the structure described above, it is possible to minimize the difference between the capacitances respectively sensed in the sensing cells formed on the first and second regions.

In this case, the difference between the third and fourth intervals (d3−d4) corresponds to the degree at which the outer surface of the thin film substrate is enlarged by the bending of the thin film substrate, which can be optimized through several experiments.

Next, referring to FIG. 4B, there are shown first sensing cells 220a' and second sensing cells 220b' adjacent to the first sensing cells 220a', which are formed on a first region having a predetermined curvature by bending the thin film substrate 10, and first sensing cells 220a" and second sensing cells 220b" adjacent to the first sensing cells 220a", which are formed on a second region as a flat region.

If the thin film substrate 10 is bent in the direction where a curved surface is formed toward the inside of the thin film substrate 10 having the sensing cells formed thereon as described above, the area where the sensing cell 220a' or 220b' positioned on the first region as the curved region is touched to the first region by the radius of the curved surface, i.e., the curvature is broader than that where the sensing cell 220a" or 220b" positioned on the second region as the flat region is touched to the second region.

That is, if the sensing cells are repetitively arranged with the same area at the same interval, regardless of the first and second regions, the contact area of the first or second sensing cell 220a' or 220b' positioned on the first region becomes broader than that of the first or second sensing cell 220a" or 220b" when the thin film substrate 10 is bent as shown in FIG. 4B, which results in the occurrence of a difference between capacitances respectively sensed in the sensing patterns on the first and second regions.

In order to solve such a problem, in the embodiment shown in FIG. 4B, the area (third area) S3 of the first or second sensing cell 220*a*' or 220*b*' formed on the first region is formed smaller than that (fourth area) S4 of the first or second sensing cell 220*a*" or 220*b*" formed on the second region. According to the structure described above, it is possible to minimize the difference between the capacitances respectively sensed in the sensing cells formed on the first and second regions. In this case, the difference between the third and fourth areas (S4−S3) can be optimized through several experiments.

Figure 5:
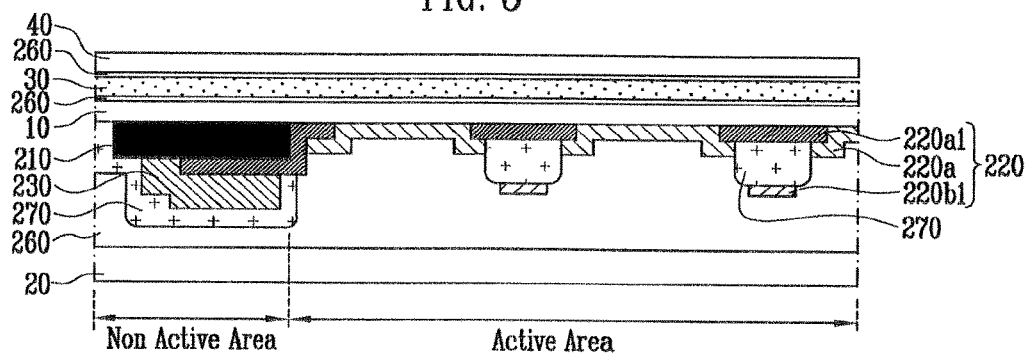
FIG. 5 is a sectional view showing one region (I-I') of a touch screen panel and a flexible display device with the same according to an embodiment of the present invention.

FIG. 5 is a sectional view showing one region (I-I') of a touch screen panel and a flexible display device with the same according to the embodiment of the present invention.

FIG. 5 is a sectional view showing portions of an active area and a non active area, which are formed on a first surface of a thin film substrate 10 in the touch screen panel, and shows a section of the flexible display device with the flexible touch screen panel.

Here, the flexible touch screen panel shown in FIG. 5 is the same as that described with reference to FIGS. 1 to 4, and therefore, its detailed description will be omitted.

The thin film substrate 10 is implemented using a material having high thermal resistance and chemical resistance, and polyimide (PI) may be used as the material of the thin film substrate 10.

In FIG. 5, there is shown a structure in which a display device 20 is attached to the lower surface of the touch screen panel, i.e., in the direction of the first surface of the thin film substrate 10 by a transparent adhesive layer 260. Here, the display device 20 is a display device having flexibility, and may be implemented as an organic light emitting display device.

For example, the organic light emitting display device is a self-luminescent device, and does not require a backlight unit, unlike existing liquid crystal display devices. Thus, in the organic light emitting display device can have flexibility by forming a substrate using polymethyl methacrylate (PMMA), acryl, polyester (PET), etc.

Here, the transparent adhesive layer 260 may be made of a transparent adhesive material having high light transmittance, such as a super view resin (SVR) or optical cleared adhesive (OCA).

As shown in this figure, the touch screen panel is implemented into a structure in which a polarizing film 30 and a window substrate 40 are stacked in the direction of a second surface of the thin film substrate 10. The polarizing film 30 and the window substrate 40 are attached to each other by the transparent adhesive layer 260.

Referring to FIG. 5, sensing patterns 220 formed on the active area of the thin film substrate 10 include first sensing cells 220*a* formed to be connected for each row line along a row direction (first direction), first connecting lines 220*a*1 connecting the first sensing cells 220*a* along the row direction, second sensing cells 220*b* formed to be connected for each column line along a column direction (second direction), and second connecting lines 220*b*1 connecting the second sensing cells 220*b* along the column direction. An insulation layer 270 is interposed between the first connecting lines 220*a*1 and the second connecting lines 220*b*1.

In FIG. 5, the thickness of each component such as the sensing patterns 220, included in the touch screen panel, is exaggerated for convenience of illustration. However, the thickness of each practical component is far thinner than the exaggerated thickness.

As shown in this figure, a black matrix 210 and sensing lines 230 are formed on the non active area positioned at the outside of the active area. Here, the sensing lines 230 are formed to overlap with the black matrix 210, and are electrically connected to the sensing patterns 220.

In this case, the black matrix 210 performs a function of forming the frame of a display area while preventing the visibility of patterns such as sensing lines formed on the non active area.

According to the structure described above, the touch screen panel is positioned between the display device 20 and the polarizing film 30, so that it is possible to preventing the visibility of the sensing patterns and to minimize reflexibility while maintaining flexibility.

The window substrate 40 attached to a top surface of the polarizing film 30 so as to enhance the strength of the device also has the flexibility of the display device 20 and the touch screen panel. Therefore, the window substrate 40 is preferably formed of a material having flexibility.

Accordingly, in this embodiment, the window substrate 40 may be made of a material such as PMMA, acryl or PET, and the thickness of the window substrate 40 may be about 0.7 mm.

In the embodiment described with reference to FIGS. 1 to 5, the sensing patterns 220 of the touch screen panel are formed on the same layer as the first and second diamond-shaped sensing cells 220*a* and 220*b*, and the insulation layer 270 is interposed between the first and second connecting lines 220*a*1 and 220*b*1 respectively connecting the first and second sensing cells 220*a* and 220*b*.

However, the sensing patterns of the touch screen panel according to this embodiment are not limited to the structure described above, and the first and second sensing cells 220*a* and 220*b* may be formed in different layers. In this case, the first sensing cells 220*a* are formed on the first surface of the thin film substrate 10, and the insulation layer 270 is formed on the first surface of the thin film substrate 10 including the first sensing cells 220*a*. The second sensing cells 220*b* are formed on the insulation layer 270 in the direction where the second sensing cells 220*b* intersect the first sensing cells 220*a*.

In a case where the first and second sensing cells 220*a* and 220*b* are formed in different layers, the first and second sensing cells 220*a* and 220*b* may be formed in a bar shape, as well as the diamond shape. Here, the separate first and second connecting lines 220*a*1 and 220*b*1 are unnecessarily provided.

Hereinafter, an embodiment in which sensing patterns of a touch screen panel are formed in a rod shape in different layers will be described in detail with reference to FIG. 6.

Figure 6:
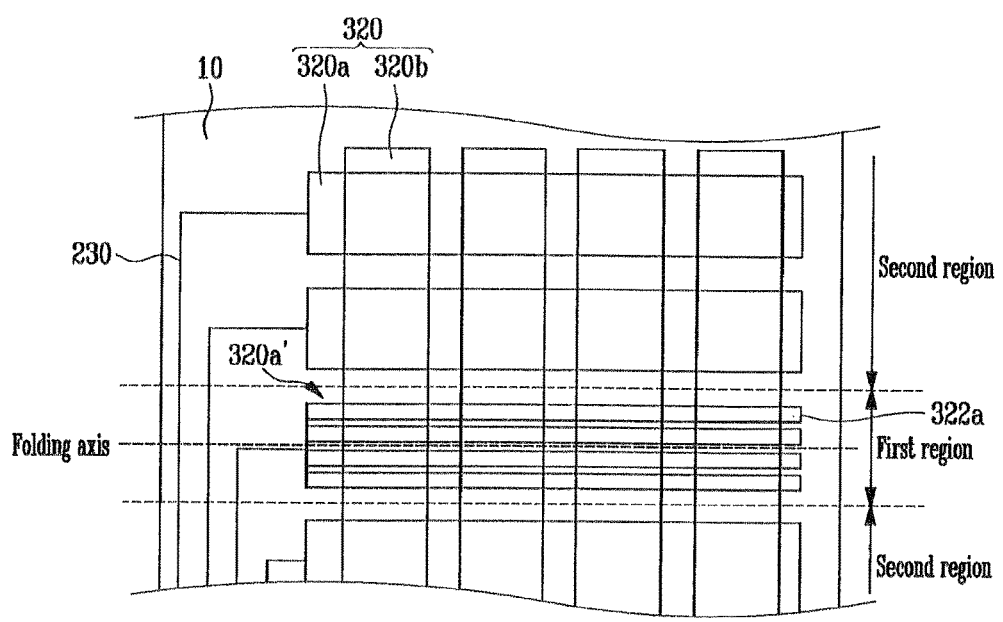
FIG. 6 is a plan view schematically showing one region of a flexible touch screen panel according to another embodiment of the present invention.

FIG. 6 is a plan view schematically showing one region of a flexible touch screen panel according to another embodiment of the present invention.

In this embodiment, components identical to those of the embodiment shown in FIG. 1 are designated by like reference numerals, and their detailed descriptions will be omitted.

Referring to FIG. 6, the touch screen panel according to this embodiment includes a thin film substrate 10 divided into an active area and a non active area positioned at the outside of the active area, and having flexibility; sensing patterns 320 formed on the active area of a first surface of the thin film substrate 10; and sensing lines 230 formed on the non active area of the first surface of the thin film substrate 10, and connecting the sensing patterns 320 to an external driving circuit (not shown) through a pad portion (not shown).

As shown in this figure, the sensing patterns 320 formed on the active area include a plurality of first sensing cells 320*a* formed to be connected for each row line along a row direction (first direction), and a plurality of second sensing cells 320*b* formed to be connected for each column line along a column direction (second direction).

The first and second sensing cells 320*a* and 320*b* may be formed in different layers. In this case, the first sensing cells 320*a* are formed on the first surface of the thin film substrate 10, and an insulation layer (not shown) is formed on the first surface of the thin film substrate 10 including the first sensing cells 320*a*. The second sensing cells 320*b* are formed on the insulation layer in the direction where the second sensing cells 320*b* intersect the first sensing cells 320*a*.

That is, unlike the embodiment shown in FIG. 1, the separate connecting lines 220*a*1 and 220*b*1 are unnecessarily in the embodiment shown in FIG. 6.

However, in the embodiment shown in FIG. 6, the thin film substrate 10 has flexibility, and accordingly, the touch screen panel is divided into a first region having a predetermined curvature based on a folding axis shown in FIG. 6, and a second region as a flat region except the first region.

As shown in this figure, the area and interval of the sensing cells formed on the first region having the predetermined curvature based on the folding axis about which the flexible touch screen panel is bent are implemented differently from those of the sensing cells formed on the second region as a flat region except the first region. Accordingly, it is possible to minimize the difference in touch sensitivity between the first and second regions, thereby improving the accuracy and precision of touch recognition.

More specifically, when assuming that the folding axis is formed in the first direction, the area and interval of first sensing cells 320*a*' arranged in the direction parallel with the folding axis on the first region are implemented differently from those of the first sensing cells 320*a* arranged on the second region.

Particularly, each of the first sensing cells 320*a*' formed on a region intersected by the folding axis in the first region is divided into a plurality of divided sensing cells 322*a*. When comparing the divided sensing cells 322*a* in the first region with the first sensing cells 320*a* formed on the second region, the area and interval of the sensing cells 322*a* are formed smaller than those of the first sensing cells 320*a*.

Here, the divided sensing cells 322*a* perform an operation as one first sensing cell 320*a*', and thus are connected to one sensing line 230 as shown in this figure.

Although the first sensing cells 320*a* and 320*a*' arranged in the first direction are formed using a transparent conductive material such as ITO, each of the first sensing cells 320*a*' arranged on the first region as the curved region is divided into the plurality of sensing cells 322*a*, and the area and interval of the sensing cells 322*a* are formed smaller than those of the first sensing cells 320*a*. Accordingly, it is possible to prevent a failure such as a crack caused by the bending of the touch screen panel.

However, in a case where the plurality of second sensing cells 320*b* arranged in the second direction intersecting the folding axis are formed using the same ITO, there may occur a failure such as a crack caused by the bending of the touch screen panel.

Accordingly, in this embodiment, the second sensing cells 320*b* are implemented as silver nano-wires (AgNW) using a transparent conductive material with excellent bendability.

Although not shown in FIG. 6, the active area is divided into two active areas, and first sensing lines (not shown) extracted from a first active area are connected to a first pad portion (not show) provided at a lower end of the non active area and second sensing lines (not shown) extracted from a second active area are connected to a second pad portion (not show) provided at an upper end of the non active area. Thus, there exists no region where the sensing lines intersect the folding axis, so that it is possible to prevent damage of the sensing lines even when the touch screen panel is repetitively bent based on the folding axis.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flexible touch screen panel comprising:
a thin film substrate including an active area and a non active area positioned at the outside of the active area, the thin film substrate having at least two second regions and a first region that is disposed between the two second regions adjacent to each other;
sensing patterns formed on the active area of a first surface of the thin film substrate, and including first sensing cells formed to be connected along a first direction and second sensing cells formed to be connected along a second direction; and
sensing lines formed on the non active area of the first surface of the thin film substrate, and connected to the sensing patterns,
wherein the flexible touch screen panel has a folding axis about which the flexible touch screen panel is bent and the folding axis is disposed in the first region,
wherein when the flexible touch screen panel is bent about the folding axis, the first region forms a curvature and the second regions maintains a flat without a curvature,
wherein an interval between the first and second sensing cells adjacent to each other in the first region is different from an interval between the first and second sensing cells adjacent to each other in the second regions, and the interval between the first and second sensing cells adjacent to each other is defined as an interval along a direction parallel to the first surface of the thin film substrate
wherein the interval between the first and second sensing cells adjacent to each other in the first region is smaller than the interval between the first and second sensing cells adjacent to each other in the second region, and
wherein the interval between the first and second sensing cells adjacent to each other in the first region is larger when the flexible touch screen panel is in a bent state than when the flexible touch screen panel is in a non-bent state, and
wherein areas of the first and second sensing cells formed on the first region are different from areas of the first and second sensing cells formed on the second regions.

2. The flexible touch screen panel of claim 1, wherein, the flexible touch screen panel is capable of being bent toward outside of the first and second sensing cells, and areas of the first and second sensing cells formed on the first region are larger than areas of the first and second sensing cells formed on the second regions.

3. The flexible touch screen panel of claim 1, wherein the sensing patterns further include first connecting lines connecting adjacent first sensing cells, and second connecting lines connecting adjacent second sensing cells.

4. The flexible touch screen panel of claim 3, further comprising an insulation layer interposed between the first connecting lines and the second connecting lines.

5. The flexible touch screen panel of claim 1, wherein the thin film substrate is made of a polyimide material.

6. The flexible touch screen panel of claim 5, wherein the thickness of the thin film substrate is about 0.005 mm to 0.05 mm.

7. The flexible touch screen panel of claim 1, wherein the first region is a region of the thin film substrate formed from one edge of the thin film substrate to another edge of the thin film substrate.

* * * * *